(12) United States Patent
Englekirk (10) Patent No.: US 9,709,620 B2
(45) Date of Patent: Jul. 18, 2017

(54) FUSE SENSE CIRCUIT AND METHOD (71) Applicant: PEREGRINE SEMICONDUCTOR CORPORATION, San Diego, CA (US)

(72) Inventor: Robert Mark Englekirk, Pacific Palisades, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 374 days.

(21) Appl. No.: 14/489,235

(22) Filed: Sep. 17, 2014

(65) Prior Publication Data

US 2016/0077146 A1    Mar. 17, 2016

(51) Int. Cl.
G01R 31/07    (2006.01)
H02H 3/04    (2006.01)

(52) U.S. Cl.
CPC .............. G01R 31/07 (2013.01); H02H 3/046 (2013.01)

(58) Field of Classification Search
CPC .................. H02H 3/046; G01R 31/07

USPC ......................................................... 324/550
See application file for complete search history.

(56) References Cited

U.S. PATENT DOCUMENTS

| 6,670,843 B1* | 12/2003 | Moench ................. G11C 17/18 327/525 |
| 2009/0009186 A1* | 1/2009 | Kaneko .................. G01R 31/07 324/550 |
| 2011/0002080 A1 | 1/2011 | Ranta |
| 2015/0123568 A1* | 5/2015 | Yang .................. H05B 33/0812 315/297 |

* cited by examiner

*Primary Examiner* — Melissa Koval
*Assistant Examiner* — Courtney McDonnough
(74) *Attorney, Agent, or Firm* — Jaquez Land Greenhaus LLP; Martin J. Jaquez, Esq.; John Land, Esq.

(57) ABSTRACT

A sense circuit and method for use in measuring the blown or unblown state of fusible links (fuses), particularly in integrated circuits. Embodiments include at least one additional reference resistance to allow for a greater margin of error in determining the actual state of a fuse. By having two or more reference resistances that can be independently selectable, additional combinations of reference resistance values are available to compare against the resistance of a fuse being tested.

6 Claims, 5 Drawing Sheets

FUSE SENSE CIRCUIT AND METHOD

BACKGROUND (1) Technical Field

This invention generally relates to electronic circuits, and more specifically to circuitry and methods for sensing the state of fusible link components used in such electronic circuits.

(2) Background

Fusible link technology in electronic circuits, particularly integrated circuits (ICs), has been in use for some time. Fusible links (also called just "fuses") are used for numerous purposes, such as chip IDs, serial numbers, and trimming. In particular, fuses are often used in electronic circuits to permanently or semi-permanently set values or states for other components within the circuit. For example, in some applications, fuses may be used to set a value for a tunable circuit element such as a digitally tunable capacitor of the type taught in U.S. patent application Ser. No. 12/735,954, Publication No. 20110002080A1, entitled "*Method and Apparatus for Use in Digitally Tuning a Capacitor in an Integrated Circuit Device*", filed on Mar. 2, 2009 and assigned to the assignee of the present invention. Such tunable circuit elements often need to be tuned only once during manufacture in order to achieve a particular design specification despite process variations and other factors that may otherwise cause circuit performance to vary from circuit to circuit. Accordingly, once such a tunable circuit element is calibrated to a desired performance level or configuration, then that static value can be embodied in a permanent or semi-permanent form using fusible links.

In general, a fuse comprises a normally conductive ("unblown") member for electrically interconnecting other circuit elements. However, the conductive member can be melted, disintegrated, or fractured ("blown" or "burned") by means of a pulse of electrical current to create an open circuit (in theory). Another method of blowing or burning a fuse, called electro-migration, involves applying a current at a level that keeps the conductive member from exploding, but still keeps it molten so that the conductive material gets carried away, outside a narrow region. This method allows for a wider section of conductive material to be displaced, and is believed to provide for a more robust product lifetime.

In some IC applications, significant quantities of fuses are required, and fuse reliability is absolutely necessary. It is therefore often critical that the actual post-production state—blown or unblown—be determined for all fuses; it is not sufficient simply to assume that a fuse that was supposed to have been "blown" was in fact fully blown, or that a fuse that was not supposed to have been "blown" was in fact unblown. Accordingly, it is generally necessary to sense the state of fusible link components used in such electronic circuits in order to verify the fusible link state (i.e., blown or unblown).

Unblown fuse resistance may typically be less than 100 ohms, whereas blown fuse resistance may be anywhere from 700 ohms if blown incompletely (i.e., partially blown) to somewhere between 4000 ohms and infinity (i.e., an open circuit) if blown completely. To sense the value of a fuse, a reference resistor is typically utilized to compare against the fuse resistance: while applying a current, if the reference resistor is higher in resistance, the fuse was not blown, whereas if the fuse is higher in resistance than the reference resistor, the fuse was blown. Commonly, to do a typical resistor comparison of this sort, some reference current is imposed on both the reference resistor and the fuse, and the difference ("delta") in voltage across the two devices is converted to digital logic levels ("0" or "1") and stored (for example, in volatile memory).

Figure 1:
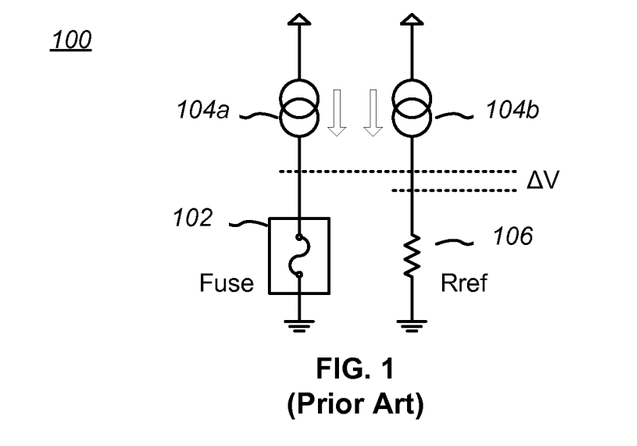
FIG. 1 is a schematic diagram of one example of a prior art fuse sensing circuit.

FIG. 1 is a schematic diagram of one example of a prior art fuse sensing circuit 100. A fuse 102 is coupled between a corresponding reference current source 104a and circuit ground. In addition, a reference resistor Rref 106 is coupled between a corresponding reference current source 104b (which may be the same source 104a coupled to the fuse 102) and circuit ground. When essentially the same current is applied to both the fuse 102 and the reference resistor Rref 106, the voltage across each element relative to circuit ground can be measured by a conventional test instrument or device or other circuit arrangement (not shown). The difference $\Delta V$ between the two measurements will determine whether the reference resistor Rref 106 is higher in resistance than the fuse 102 (indicating that the fuse 102 was not blown), or if the fuse 102 is higher in resistance than the reference resistor Rref 106 (indicating that the fuse 102 was blown). In a typical application, if $\Delta V$ indicates an unblown state, a logic "0" is stored in an associated latch circuit, and if $\Delta V$ indicates a blown state, a logic "1" is stored in the associated latch circuit. At a later time, the latched value may be read back to determine the previously measured state of the fuse.

The amount of current used for measurement cannot be too high because otherwise the current may damage (i.e., partially "blow") an unblown fuse. Thus, a limit is generally set on how much differential voltage can be created without damaging a fuse. In a typical example, the reference resistor value is set about half way between the expected blown and unblown fuse resistance values. For example, if the minimum standard for considering a fuse to be blown is about 2100 ohms and the unblown resistance value for the fuse is expected to be about 100 ohms, then 1100 ohms may be a good choice for the reference resistor (i.e., about 1000 ohms from the end-point fuse resistance values of 100 ohms and 2100 ohms). If the maximum current that the fuse can tolerate is around 150 µA, that leaves an error margin of about 150 mV of differential voltage to be sensed (1000 ohms×150 µA=150 mV). The minimum sensed voltage has to be large enough, and the sense circuit has to be accurate enough, that there are no mistakes in the reading. In the example given here, the voltage across a blown fuse should be about 15 mV (100 ohms×150 µA), whereas the voltage across an unblown fuse should be about 315 mV (2100 ohms×150 µA). Accordingly, it is relatively easy to distinguish those voltages from the voltage across an 1100 ohm reference resistor (1100 ohms×150 µA=165 mV).

Sometime a fuse is not blown properly due to defects in the fuse or fuse burning circuitry, or, in the case of electro-migration, because a sufficient amount of conductive material has not migrated. Further, a fuse may not be read correctly because sense circuit or other problems may occur in the test setup. If a blown fuse value is still above the reference resistor value but only by a small amount, there may be circumstances where the fuse resistance value would read properly in manufacturing screening, but fail (e.g., be read as not blown) in the field, particularly if different testing equipment is used. Reducing the value of the reference resistor is one option, but doing so decreases the noise margin for determining that a fuse is unblown.

Accordingly, there is a need for a reliable way of sensing the state of fusible links, some of which are unblown and some of which are supposed to have been blown. The present invention addresses this need.

SUMMARY OF THE INVENTION

The invention encompasses embodiments of a sense circuit and method for use in measuring the blown or unblown state of a fuse, particularly in integrated circuits. Various embodiments include at least one additional reference resistance to allow for a greater margin of error between manufacturing screening and end use testing. By having two or more reference resistances that can be independently selectable, additional combinations of reference resistance values are optionally available to compare against the resistance of a fuse being tested. For example, with two reference resistors, R1 and R2, a fuse can be compared against each reference resistor individually, and also optionally against the combination (parallel or series) of the reference resistors. For a parallel combination, by careful choice of the values for the reference resistors, R1 can be the final desired "in-field" mid-level resistance value, whereas R2 can be a high resistance value to screen for poor fuse burns, and the parallel combination of R1∥R2 can be a low resistance value to ensure error margin on the unblown side of the test spectrum. For a series combination, by careful choice of the values for the reference resistors, R1 can be a low resistance value to ensure error margin on the unblown side of the test spectrum, R2 can be the final desired "in-field" mid-level resistance value, and the series combination R1+R2 can be a high resistance value to screen for poor fuse burns. In alternative embodiments, three or more reference resistors may be used individually (i.e., without combining them during a single test phase) to accomplish the same determinations, or used in combination to provide multiple ranges for testing a fuse. In other embodiments, a variable resistance device may be used to provide two or more resistance values that may be compared against a fuse being tested. In still other embodiments, two distinct reference resistance values may be compared against the resistance of a fuse under test if error margin is only needed on one side of the test spectrum (i.e., testing if a fuse has margin on the blown or unblown side, but not both).

Embodiments of the invention are useful for programming functionality into an application circuit by means of fuses, including permanently assigning a part identifier to an application circuit and/or changing internal truth tables or settings that control operation of the circuit. Embodiments of the invention are also useful for correcting for manufacturing process variations. For example, with radio frequency (RF) application circuits in particular, the performance of a circuit often varies from part to part due to process variations. By incorporating adjustable or tunable elements in each part (e.g., a digitally tunable capacitor), a part can be calibrated after manufacture to a desired specification and then the necessary settings for that part can be encoded using fuses.

Another aspect of the invention includes multiple "fuse unit cells" that are addressable from an external source. The fuse unit cells include circuitry for comparing the resistance of a fuse against two or more reference resistances and latching the result for future readout.

Another aspect of the invention includes various methods for determining the state (blown or unblown) of a fuse, including a method for comparing the resistance of a fuse to a plurality of different reference resistances and determining the blown or unblown state of the fuse by requiring that each state meet or exceed (positively or negatively) at least two separate comparisons.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The invention encompasses embodiments of a sense circuit and method for use in measuring the blown or unblown state of fusible links (fuses), particularly in integrated circuits. Various embodiments include at least one additional reference resistance to allow for a greater margin of error between manufacturing screening and end use testing. By having two or more reference resistances that can be independently selectable, additional combinations of reference resistance values are available to compare against the resistance of a fuse being tested.

For example, with two reference resistors, R1 and R2, a fuse can be compared against each reference resistor individually, and also against the combination (parallel or series) of the reference resistors. For a parallel combination, by careful choice of the values for the reference resistors, R1 can be a final desired "in field" mid-level resistance value, whereas R2 can be a high resistance value to screen for poor fuse burns, and the parallel combination of R1∥R2 can be a low resistance value to ensure error margin on the unblown side of the test spectrum. For a series combination, by careful choice of the values for the reference resistors, R1 can be a low resistance value to ensure error margin on the unblown side of the test spectrum, R2 can be a final desired "in field" mid-level resistance value, and the series combination R1+R2 can be a high resistance value to screen for poor fuse burns. In alternative embodiments, three or more reference resistors may be used individually (i.e., without combining them during a single test phase) to accomplish the same determinations, or used in combination to provide multiple ranges for testing a fuse. In other embodiments, a variable resistance device may be used to provide two or more resistance values that may be compared against a fuse being tested. In still other embodiments, two distinct reference resistance values may be compared against the resistance of a fuse under test if error margin is only needed on one side of the test spectrum (i.e., testing if a fuse has margin on the blown or unblown side, but not both).

Embodiments of the invention are useful for programming functionality into an application circuit by means of fuses, including permanently assigning a part identifier to an application circuit and/or changing internal truth tables or settings that control operation of the circuit. Embodiments of the invention are also useful for correcting for manufacturing process variations. For example, with radio frequency (RF) application circuits in particular, the performance of a circuit often varies from part to part due to process variations. By incorporating adjustable or tunable elements in each part (e.g., a digitally tunable capacitor), a part can be calibrated after manufacture to a desired specification and then the necessary settings for that part can be encoded using fuses.

Figure 2:
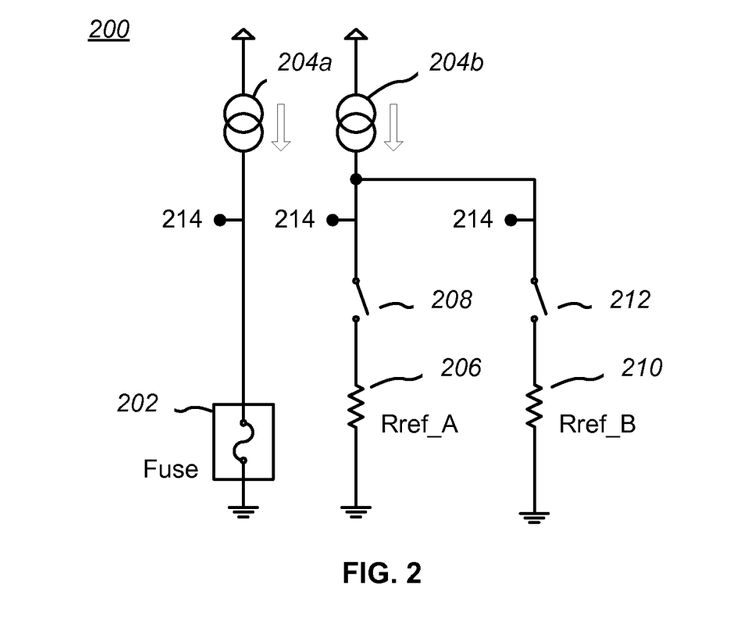
FIG. 2 is a schematic diagram of a first embodiment of a fuse sensing circuit in accordance with the present invention.

FIG. 2 is a schematic diagram of a first embodiment of a fuse sensing circuit 200 in accordance with the present invention. The fuse sensing circuit 200 typically will be fabricated as part of an application circuit (e.g., an IC) but some or all of it may be fabricated as an external testing circuit. In some applications, it may be advisable to test some or all of the fuses to determine their actual state before attempting to blow those fuses, in order to determine if those fuses are defective. After one or more fuses in an application circuit have been blown, some or all of the fuses may be tested to determine their actual state. In the illustrated embodiment, a fuse 202 is coupled between a corresponding reference current source 204a and circuit ground. A first reference resistor Rref_A 206 is coupled between a corresponding reference current source 204b (which may be a source similar or identical to the source 204a coupled to the fuse 202) to circuit ground through an associated switch 208. In parallel, a second reference resistor Rref_B 210 is coupled between the reference current source 204b and circuit ground through an associated switch 212.

If a suitable current is applied to both the fuse 202 and the first reference resistor Rref_A 206 while its associated switch 208 is closed (and the other switch 212 is open), the voltage across each element relative to circuit ground (e.g., from corresponding test points 214 to ground) can be measured by a conventional test instrument or device or other circuit arrangement (not shown, but see FIG. 7 below). The difference $\Delta V1$ between the two measurements will determine whether the first reference resistor Rref_A 206 is higher or lower in resistance than the fuse 202. Similarly, if a suitable current is applied to both the fuse 202 and the second reference resistor Rref_B 210 while its associated switch 212 is closed (and the other switch 208 is open), the voltage across each element relative to circuit ground can be measured. The difference $\Delta V2$ between the two measurements will determine whether the second reference resistor Rref_B 210 is higher or lower in resistance than the fuse 202.

In a third configuration, both switches 208, 212 are closed, thus effectively coupling the first reference resistor Rref_A 206 and the second reference resistor Rref_B 210 in parallel electrically, effectively creating a third reference resistor Rref_C=Rref_A∥Rref_B. When a suitable current is applied to both the fuse 202 and the parallel combination of Rref_A 206 and Rref_B 210, the voltage across each element relative to circuit ground can be measured. The difference $\Delta V3$ between the two measurements will determine whether the parallel combination of Rref_A 206 and Rref_B 210 is higher or lower in resistance than the fuse 202.

The illustrated embodiment uses reference resistors with values selected to differentiate blown and unblown fuses based on the measured values of $\Delta V1$, $\Delta V2$, and $\Delta V3$. For example, in one specific implementation, three reference resistor values were used: Rref_A=1996 ohms, Rref_B=1378 ohms, and Rref_C=Rref_A∥Rref_B=814 ohms. With these values and a particular application circuit under test during manufacturing, and applying a very conservative "double comparison" testing procedure, a fuse 202 will only be deemed to be unblown if its resistance is less than both the 1378 ohm and 814 ohm reference resistors for selected circuit voltages (typically from about 1.65V to 1.95V in this embodiment). Conversely, for the same circumstances, a fuse 202 will only be deemed to be blown if its resistance is greater than both the 1378 ohm and 1996 ohm reference resistors for the same selected voltages. If a fuse 202 does not pass the above two tests, the tested application circuit may be rejected or repurposed for a use in which the actual fuse state is not critical. As noted above, a fuse 202 having an unblown state can be represented by a logic "0", and a fuse 202 having a blown state can be represented by a logic "1"; of course, the reverse assignment of logic state can be used in alternative designs.

Using a less conservative "single comparison" testing procedure during manufacturing, a fuse 202 will only be deemed to be unblown if its resistance is less than the reference resistor having the lowest resistance value (e.g., using the above specific example, 814 ohms). Conversely, a fuse 202 will only be deemed to be blown if its resistance is greater than the reference resistor having the highest resistance value (e.g., using the above specific example, 1996 ohms).

As should be clear to one of ordinary skill in the art, other resistance values may be selected for the reference resistances in other embodiments of the invention adapted for particular purposes. In addition, in some embodiments, the measured characteristic of a fuse and one or more selected reference resistances may be current or resistance rather than voltage, since all three values are related by Ohm's Law (V=IR).

Comparing each fuse 202 against two or more reference resistances instead of only a single reference resistance gives greater certainty that the measured $\Delta V$'s accurately represent the relative resistance of a fuse 202 and those reference resistances with a clear error margin. Further, since the fuse sense circuit may be embodied within the same circuitry as the application circuit, post-manufacture testing (such as by a customer) to verify the state of the fuses in an application circuit can be done in a simple and fast manner. For example, in the specific implementation described above, the reference resistances were selected so that Rref_B is at least about 500 ohms below Rref_A and at least about 500 ohms above Rref_C (i.e., the combination Rref_A∥Rref_B). After powering up the application circuit, an automatic fuse-sense cycle can be initiated using only the middle reference resistor (Rref_B=1378 ohms). Since the initial test ensured that an unblown fuse was at least 500 ohms below 1378 ohms, and that a blown fuse was at least 500 ohms above 1378 ohms, a test of a fuse against the mid-level 1378 ohm reference resistor alone will indicate the actual blown or unblown state of the fuse with a fairly large margin for error.

Thus, with either double or single comparisons during manufacturing, the state of a fuse may be read in the field (for example, by a customer) by comparing the resistance of the fuse to a reference resistor having a resistance value that is between the values of the high and low reference resistors used during manufacturing. The high and low reference resistors used during manufacturing essentially insure that all fuses passing the testing process in fact have the state indicated by the test results. If the high and low reference resistors differ significantly in resistance from the "middle" reference resistor, there is a significant margin of error that helps insure that a single reading taken in the field using only the "middle" reference resistor will reflect the actual state of the fuse. Thus, using the example from above, if a fuse is compared in the field to only a 1378 ohm reference resistor and the resistance of the fuse is lower than that reference resistor, the fuse will be correctly read as being unblown (since during manufacturing that fuse was also determined to have less resistance than an 814 ohm reference resistor). Conversely, using the same example, if a fuse is compared in the field to only a 1378 ohm reference resistor and the resistance of the fuse is greater than that reference resistor, the fuse will be correctly read as being blown (since during manufacturing that fuse was also determined to have more resistance than a 1996 ohm reference resistor).

Figure 3:
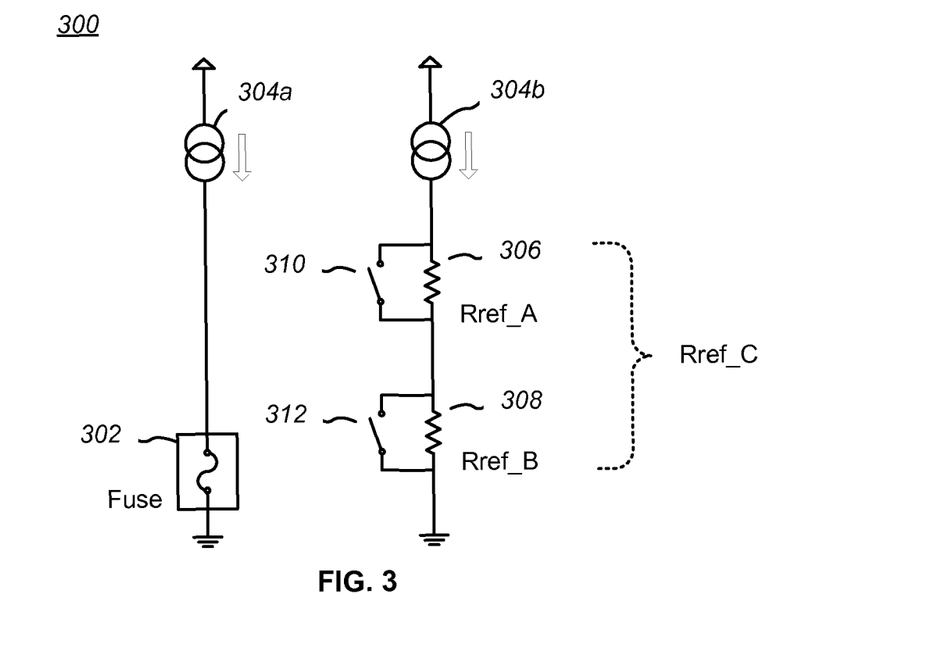
FIG. 3 is a schematic diagram of a second embodiment of a fuse sensing circuit in accordance with the present invention.

FIG. 3 is a schematic diagram of a second embodiment of a fuse sensing circuit 300 in accordance with the present invention. In the illustrated embodiment, a fuse 302 is coupled between a corresponding reference current source 304$a$ and circuit ground. In addition, a pair of series connected reference resistors Rref_A 306 and Rref_B 308 are coupled between a corresponding reference current source 304$b$ (which may be a source similar or identical to the source 304$a$ coupled to the fuse 302) and circuit ground. In parallel with each reference resistor Rref_A 306 and Rref_B 308 are corresponding associated bypass switches 310, 312. In operation, reference resistor Rref_A 306 may be individually tested against the measured resistance of the fuse 302 by opening its corresponding bypass switch 310 and closing the bypass switch 312 corresponding to reference resistor Rref_B 308; closing switch 312 essentially bypasses Rref_B 308. Conversely, reference resistor Rref_B 308 may be individually tested against the measured resistance of the fuse 302 by opening its corresponding bypass switch 312 and closing the bypass switch 310 corresponding to reference resistor Rref_A 306; closing switch 310 essentially bypasses Rref_A 306. By optionally opening both bypass switches 310, 312, the resistances of the reference resistors Rref_A 306 and Rref_B 308 are combined to effectively create a third reference resistor Rref_C=Rref_A+Rref_B, which may be tested against the measured resistance of the fuse 302. As in the embodiment illustrated in FIG. 2, the values of the reference resistors Rref_A and Rref_B should be selected so that the resistance values (Rref_A alone, Rref_B alone, and, optionally, Rref_A+Rref_B) to be tested against the fuse 302 produce a clear indication based on measured differences in voltage, current, and/or resistance to differentiate an unblown and blown fuse with a fairly large margin for error. As one example, possible resistance values are Rref_A=700 ohms, Rref_B=1400 ohms, and Rref_C=Rref_A+Rref_B=2100 ohms (there may be some additional resistance through a closed bypass switch that can be taken into account as well).

Figure 4:
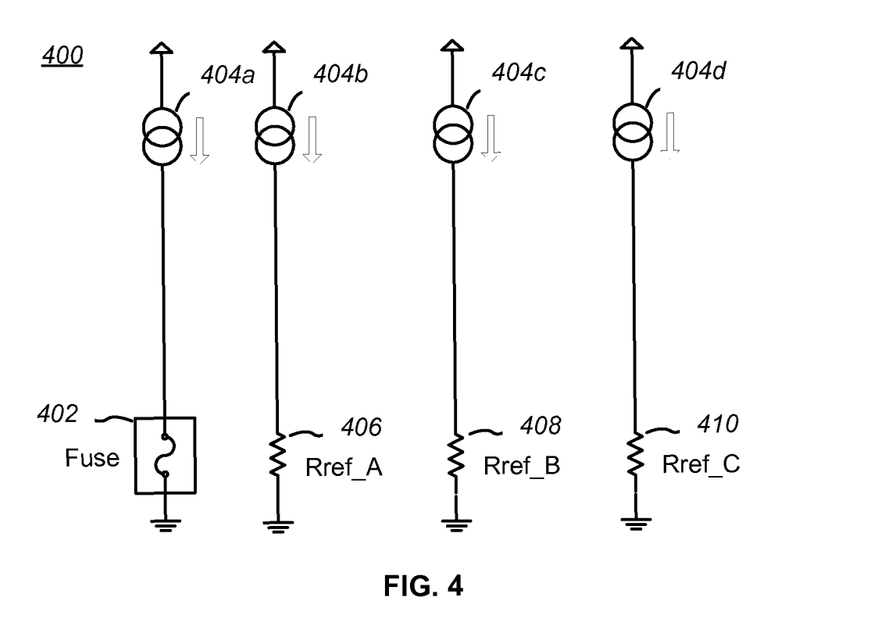
FIG. 4 is a schematic diagram of a third embodiment of a fuse sensing circuit in accordance with the present invention.

FIG. 4 is a schematic diagram of a third embodiment of a fuse sensing circuit 400 in accordance with the present invention. This embodiment illustrates that more than two reference resistors may be included (three are shown), either to allow simple selection of each reference resistor (Rref_A, Rref_B, or Rref_C in this example) and otherwise operating like the embodiment of FIG. 2, or to allow additional comparison ranges if the reference resistors are combined by switching them in or out of circuit (switches not shown, but see FIG. 2 for a switched configuration). In this example, fuse 402 is coupled between circuit ground and a reference current source 404$a$. Similarly, reference resistors Rref_A 406, Rref_B 408, and Rref_C 410 are coupled between circuit ground and a corresponding reference current source 404$b$, 404$c$, and 404$d$. Accordingly, the resistance of the fuse 402 may be compared to the resistance of any of the reference resistors Rref_A 406, Rref_B 408, or Rref_C 410 individually by enabling the corresponding reference current source 404$b$, 404$c$, or 404$d$. However, by suitable switching, the resistance of the fuse 402 may be compared to the resistance of any of the individual reference resistors and to the following combinations: Rref_A∥Rref_B; Rref_A∥Rref_C; Rref_B∥Rref_C; and Rref_A∥Rref_B∥Rref_C. Similarly, the series configuration shown in FIG. 3 can be readily adapted to include more than two reference resistors 306, 308 to enable additional combinations.

As is readily apparent from the above description, other combinations of multiple parallel and/or series connected reference resistances may be used. For example, the series configuration shown in FIG. 3 can be adapted to the configuration shown in FIG. 2, such that the individual reference resistors 206, 201$\theta$ in FIG. 2 are replaced by two or more series connected reference resistors (with bypass switches) of the type shown in FIG. 3, thus allowing more combinations of resistance values. Further, some or all of the reference resistors described in the above embodiments may be implemented as either passive devices or as active devices that exhibit electrical resistance, such as field effect transistors (FETs). In general, at least three distinct resistance values may be compared against the resistance of a fuse under test: at least high and low resistance values are used during manufacturing testing, and a "middle" value is used in field testing. However, only two distinct resistance values need be compared against the resistance of a fuse under test if error margin is only needed on one side (i.e., blown or unblown, but not both). Thus, for example, if it is only important to verify that a fuse is blown, then during manufacturing a fuse may be compared against only a high value reference resistor (e.g., 1996 ohms, using the example from above). Fuses screened in this manner may then be verified by testing against a lower valued reference resistor (e.g., 1378 ohm, again using the example from above). A similar arrangement can be used for screening and verifying only unblown fuses. As discussed further below, the reference resistors (two, three, or more, as the case may be) may be included as part of an application circuit to facilitate such testing.

Figure 5:
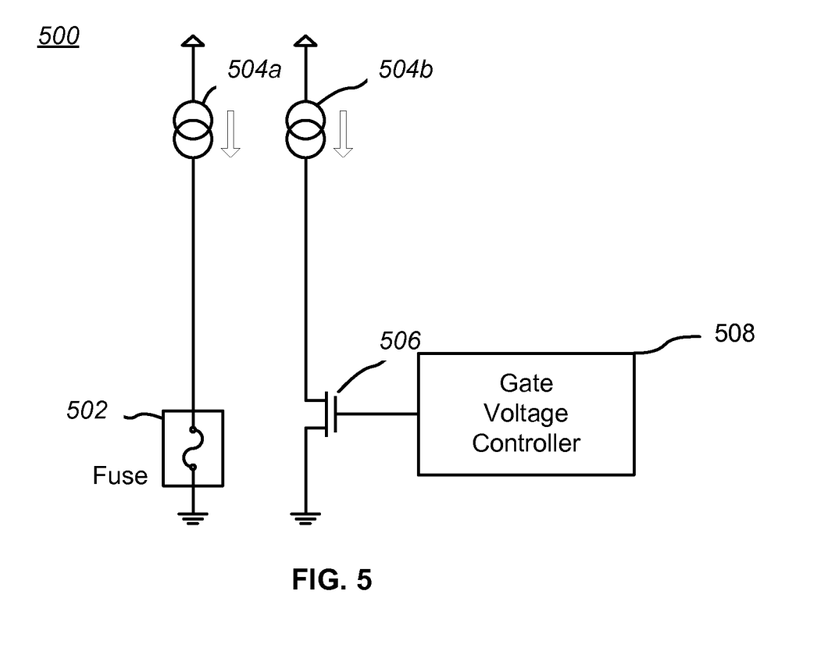
FIG. 5 is a schematic diagram of a fourth embodiment of a fuse sensing circuit in accordance with the present invention.

In some embodiments, a single variable resistance device can be used in lieu of two or more individual resistors. For example, FIG. 5 is a schematic diagram of a fourth embodiment of a fuse sensing circuit 500 in accordance with the present invention. In the illustrated embodiment, a fuse 502 is coupled between a corresponding reference current source 504$a$ and circuit ground. A reference FET 506 is coupled between a corresponding reference current source 504$b$ (which may be similar or identical to source 504$a$ coupled to the fuse 502) to circuit ground. By setting the gate voltage of the single FET to suitable levels, the FET can be selectively set to at least two different resistance values or states that may be compared to the resistance of a fuse under test. In the illustrated embodiment, the gate of the FET 506 is coupled to a gate voltage controller 508 that can selectively set the effective resistance of the FET 506 to any of three different values (e.g., 700 ohms, 1400 ohms, and 2100 ohms). Accordingly, the resistance of the fuse 502 may be compared to a plurality of different effective reference resistances to determine the blown or unblown state of the fuse 502 by requiring that each state meet or exceed at least two separate comparisons. Alternatively, if error margin is only needed on one side (i.e., blown or unblown, but not both), then only two different reference resistance values are needed for comparison.

Figure 6:
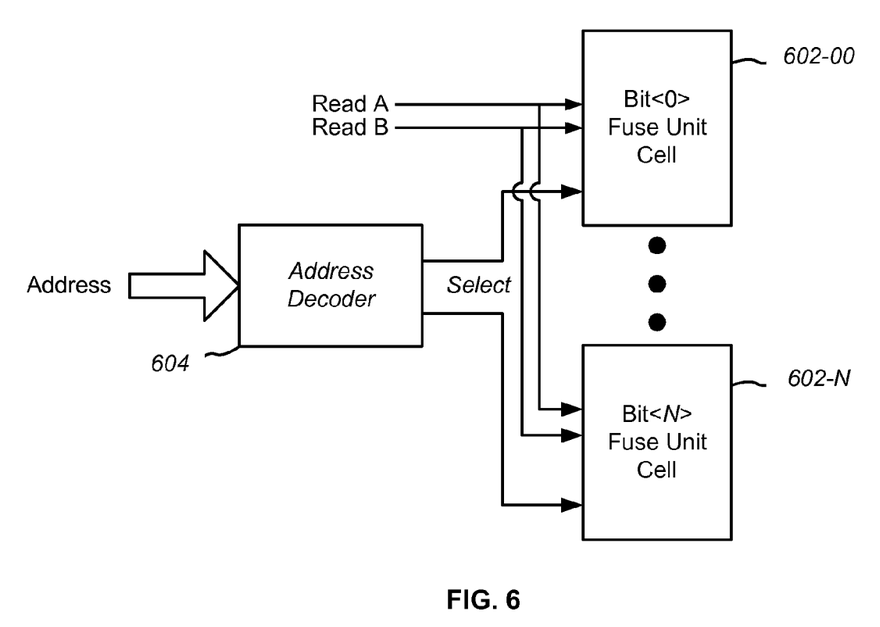
FIG. 6 is a block diagram of a set of fuse unit cells that include circuitry for comparing the resistance of a fuse against two or more reference resistances.

As noted above, significant quantities of fuses are required in some IC applications. It may be convenient to provide multiple "fuse unit cells" that are addressable from an external source using a limited number of external connections. FIG. 6 is a block diagram of a set of fuse unit cells 602-00 through 602-N that include circuitry for comparing the resistance of a fuse against two or more reference resistors and latching the result for future readout. In this example, an address decoder 604 converts an externally supplied address of width W to one of N select lines coupled to corresponding fuse unit cells 602-00 through 602-N (as an example, W may be 5 bits and N may be 32).

Each fuse unit cell is also coupled to two read control lines, Read A and Read B (although in some applications more than two read control lines may be used). In some embodiments, the two read control lines, Read A and Read B, can be just additional address bits; for example, the two most significant bits of an address of width W may be used to directly enable Read A (e.g., "01"), Read B (e.g., "10"), and the combination of Read A and Read B (e.g., "11"), with the fourth state (e.g., "00") disabling fuse sense reading entirely.

Other addressing techniques may be used if the fuse unit cells are configured in other known ways, such as converting an encoded address to row and column (XY) control lines for a two-dimensional array of fuse unit cells, or to row/column/level (XYZ) control lines for a three-dimensional or quasi-three-dimensional array of fuse unit cells.

Figure 7:
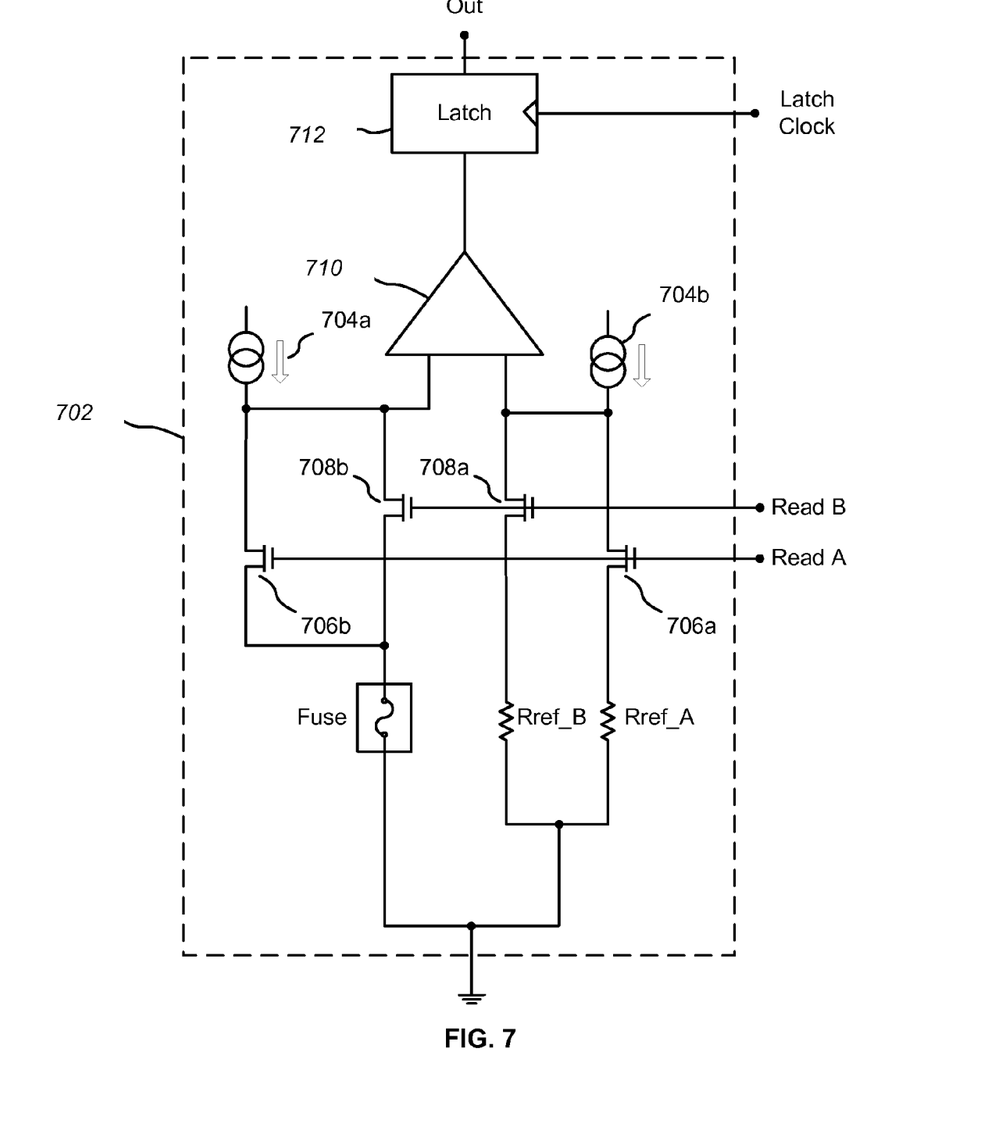
FIG. 7 is a block diagram of a fuse unit cell of the type shown in FIG. 6 coupled to corresponding reference resistances and a fuse.

FIG. 7 is a block diagram of a fuse unit cell 702 of the type shown in FIG. 6 coupled to corresponding reference resistors and a fuse. In this embodiment, the fuse and the reference resistors Rref_A and Rref_B may be selectively coupled between circuit ground and respective current sources 704a, 704b. A first read control line, Read A, controls associated switches 706a, 706b, and a second read control line, Read B, controls associated switches 708a, 708b. The Read A and Read B control lines selectively couple either or both of corresponding reference resistors Rref_A, Rref_B through corresponding switches 706a, 708a to a corresponding current source 704b and to one input of a differential amplifier 710. The Read A and Read B control lines also couple the fuse under test through corresponding switches 706b, 708b to a corresponding current source 704a and to the other input of the differential amplifier 710. The output of the differential amplifier 710 is coupled to a latch 712, which is activated in this example by a fuse unit cell Latch Clock signal. (Note that the form and function of the differential amplifier 710 and latch 712 can take on many forms and the latch 712 may not need to be clocked separately. For example, in some applications, the latch 712 is overridden when Read A and/or Read B are logic highs, and thus there is no need for a Latch Clock signal.) Omitted for clarity is additional circuitry of conventional design used for blowing the fuse and for coupling the fuse to other elements of an application circuit.

When the state of the fuse in FIG. 7 is to be read, an appropriate address is applied to the address decoder of FIG. 6, and the Fuse Unit Cell Select line for the addressed fuse activates the latch 712. Control circuitry (not shown, but which may include external address lines) then selects one or both of the read control lines, Read A and Read B, which couples one or both of the reference resistors Rref_A, Rref_B to one input of the differential amplifier 710, and the fuse to the other input of the differential amplifier 710. With this configuration, it is not necessary to use a separate test instrument or device to measure the respective resistances of the fuse and the reference resistors Rref_A, Rref_B (or voltage or current) and then record the result; instead, the resistance difference will manifest itself as a voltage difference, $\Delta V$, applied to the inputs of the differential amplifier 710. Thus, for example, if the voltage applied at the reference resistor input of the differential amplifier 710 is higher than the voltage applied at the fuse input of the differential amplifier 710, the output to the latch 712 will be set to a state indicating a logic "0". Conversely, if the voltage applied at the reference resistor input of the differential amplifier 710 is lower than the voltage applied at the fuse input, the output to the latch 712 will be set to a state indicating a logic "1". (Of course, which binary state is associated with a particular measurement is a design choice). Accordingly, the fuse unit cell 702 shown in FIG. 7 serves as a comparator device that both determines the analog differential voltage across the fuse and one or more selected reference resistors, and stores (latches) that difference as a digital logic value.

Referring to FIG. 7, it should be noted that each fuse unit cell 702 in an application circuit may have associated dedicated reference resistors. Alternatively, a set of reference resistors may be switchably connectable to more than one fuse unit cell 702, in order to provide a relatively constant set of resistance values for comparison to multiple fuse unit cells (assuming that switch resistances and circuit paths impose negligible resistance variances). Also, each fuse unit cell 702 may include additional circuitry (not shown) to set or reset its latch 712 to a known state before blowing or testing an associated fuse. In some applications (for example, because of internal bias and switch differences that may exist within a fuse unit cell 702), it may be useful to set the latch 712 of a fuse unit cell 702 and test the state of its associated fuse, and then reset the latch 712 and re-test the fuse in order to see if the same result is reached.

As should be readily apparent to one of ordinary skill in the art, various embodiments of the invention can be implemented to meet a wide variety of specifications. Thus, selection of suitable component values are a matter of design choice. The switching and passive elements may be implemented in any suitable integrated circuit (IC) technology, including but not limited to MOSFET and IGFET structures. Integrated circuit embodiments may be fabricated using any suitable substrates and processes, including but not limited to standard bulk silicon, silicon-on-insulator (SOI), silicon-on-sapphire (SOS), GaAs pHEMT, and MESFET processes. Voltage levels may be adjusted or voltage polarities reversed depending on a particular specification and/or implementing technology (e.g., NMOS, PMOS, or CMOS). Component voltage, current, and power handling capabilities may be adapted as needed, for example, by adjusting device sizes, "stacking" components to handle greater voltages, and/or using multiple components in parallel to handle greater currents.

In particular, the switches 706a, 706b, 708a, 708b, and the latch 712 of a fuse unit cell 702 may be implemented in a variety of technologies, including field effect transistors (FETs). A FET device can exhibit potentially confounding or problematic characteristics due to accumulated charge within the device structure. Accordingly, it may be useful in many applications to use FETs that include the "HaRP"™ accumulated charge sink (ACS) technology taught in U.S. Pat. No. 7,910,993, assigned to the assignee of the present invention and incorporated herein by this reference.

Another aspect of the invention includes a method for comparing the resistance of a fuse to a plurality of different reference resistances and determining at least one of the blown or unblown states of the fuse by requiring that at least one such state meet or exceed (positively or negatively) at least two separate comparisons (which may be done at separate points in time or location).

Yet another aspect of the invention includes a method for sensing the state of a fuse in an electronic circuit, including the steps of:

STEP 1: comparing the resistance of the fuse to a first reference resistance;

STEP 2: comparing the resistance of the fuse to a second reference resistance, the second reference resistance being greater than the first reference resistance;

STEP 3: determining that the fuse is in an unblown state if the resistance of the fuse is less than or equal to the resistance of the first reference resistance; and STEP 4: determining that the fuse is in a blown state if the resistance of the fuse is greater than or equal to the resistance of the second reference resistance.

For field testing, the above method can be extended to verifying the blown or unblown state of a fuse by comparing the resistance of the fuse to a third "middle" reference resistance (i.e., a reference resistance having a resistance value that falls between the resistance values of the first and second reference resistances). As noted above, a test of a fuse against a "middle" reference resistance alone will indicate the actual blown or unblown state of the fuse with a fairly large margin for error, since all parts are screened during manufacture as described above. The above method further includes the third reference resistance being a combination of the first and second reference resistances.

Furthermore, if only one state (blown or unblown) requires margin for a particular application circuit, then the following steps may be performed:

STEP 1: providing a circuit embodying a fuse with a first reference resistance and a second reference resistance of different resistance values, the second reference resistance value being selected to provide an error margin for determining a desired state for the fuse;

STEP 2: comparing the resistance of the fuse to the first reference resistance as part of a first testing event for the circuit;

STEP 3: comparing the resistance of the fuse to the second reference resistance as part of a second testing event for the circuit; and STEP 4: determining the state of the fuse as being the desired state for the fuse if the resistance of the fuse differs from the second reference resistance by at least the error margin.

Typically, the first testing event would be during manufacture of the circuit, and the second testing event would be field testing of the circuit.

Yet another aspect of the invention includes a method for sensing the state of a fuse in an electronic circuit, including the steps of:

STEP 1: comparing the resistance of the fuse to a first reference resistance;

STEP 2: comparing the resistance of the fuse to a second reference resistance;

STEP 3: comparing the resistance of the fuse to a third reference resistance; and STEP 4: determining that the fuse is in an unblown state if the resistance of the fuse is less than or equal to the resistance of both the first reference resistance and the second reference resistance; and STEP 5: determining that the fuse is in a blown state if the resistance of the fuse is greater than or equal to the resistance of both the second reference resistance and the third reference resistance.

A number of embodiments of the invention have been described. It is to be understood that various modifications may be made without departing from the spirit and scope of the invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:

1. A method for determining at least one of the unblown or blown states of a fuse in an electronic circuit, the unblown state being associated with a first range of resistances, and the blown state being associated with a second range of resistances, and wherein the fuse may be in an intermediate state having a resistance between the first and second first range of resistances, including:
   (a) comparing the resistance of the fuse to a plurality of different reference resistances, at least two of the different reference resistances each having an associated resistance value greater than the first range of resistances and less than the second range of resistances; and
   (b) determining at least one of the blown or unblown states of the fuse by requiring that at least one such state meet or exceed at least two separate comparisons.

2. The method of claim 1, wherein the plurality of reference resistances are generated by a variable resistance device.

3. The method of claim 2, wherein the variable resistance device is a field effect transistor.

4. A circuit for sensing at least one of the unblown or blown states of a fuse in an electronic circuit, the unblown state being associated with a first range of resistances, and the blown state being associated with a second range of resistances, and wherein the fuse may be in an intermediate state having a resistance between the first and second first range of resistances, including:
   (a) a plurality of different reference resistances, at least two of the different reference resistances each having an associated resistance value greater than the first range of resistances and less than the second range of resistances; and
   (b) testing circuitry, coupled to the fuse and to select ones of the different reference resistances, for determining at least one of the blown or unblown states of the fuse by requiring that at least one such state meet or exceed at least two separate comparisons.

5. The circuit of claim 4, wherein the plurality of reference resistances are generated by a variable resistance device.

6. The circuit of claim 5, wherein the variable resistance device is a field effect transistor.

* * * * *